(12) United States Patent
Laine et al.

(10) Patent No.: US 10,037,986 B2
(45) Date of Patent: Jul. 31, 2018

(54) ESD PROTECTION STRUCTURE AND METHOD OF FABRICATION THEREOF

(71) Applicant: Freescale Semiconductor, Inc., Austin, TX (US)

(72) Inventors: Jean Philippe Laine, Saint Lys (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/830,038

(22) Filed: Aug. 19, 2015

(65) Prior Publication Data
US 2016/0276332 A1   Sep. 22, 2016

(30) Foreign Application Priority Data
Mar. 19, 2015   (WO) .................. PCT/IB2015/000536

(51) Int. Cl.
| | |
|---|---|
| *H01L 21/70* | (2006.01) |
| *H01L 29/02* | (2006.01) |
| *H01L 29/66* | (2006.01) |
| *H01L 21/02* | (2006.01) |
| *H01L 27/02* | (2006.01) |

(Continued)

(52) U.S. Cl.
CPC ........ *H01L 27/0251* (2013.01); *H01L 21/761* (2013.01); *H01L 21/76283* (2013.01); *H01L 29/66393* (2013.01); *H01L 29/7436* (2013.01); *H01L 29/735* (2013.01)

(58) Field of Classification Search
CPC ............... H01L 27/0251; H01L 21/761; H01L 21/76283; H01L 29/6625; H01L 29/66393; H01L 29/735

USPC ....... 257/164, 506, 173, 566, 110, 487, 577, 257/538; 438/135, 133, 270
See application file for complete search history.

(56) References Cited

U.S. PATENT DOCUMENTS

| | | | |
|---|---|---|---|
| 6,268,630 B1 * | 7/2001 | Schwank | ................ H01L 21/84 257/347 |
| 8,390,092 B2 | 3/2013 | Gendron et al. | |

(Continued)

FOREIGN PATENT DOCUMENTS

WO       2014041388 A1      3/2014

OTHER PUBLICATIONS

Notice of Allowance dated Jan. 12, 2018 for U.S. Appl. No. 14/829,961, 12 pages.

(Continued)

*Primary Examiner* — Dzung Tran

(57) ABSTRACT

An ESD protection structure formed within an isolation trench and comprising a first peripheral semiconductor region of a first doping type, a second semiconductor region of the first doping type, and a semiconductor structure of a second doping type opposite to the first doping type formed to provide lateral isolation between the semiconductor regions of the first doping type and isolation between the further semiconductor region of the first doping type and the isolation trench. The semiconductor structure of the second doping type is formed such that no semiconductor region of the second doping type is formed between a peripheral side of the first semiconductor region of the first doping type and a wall of the isolation trench, and no semiconductor region of the first doping type is in contact with the isolation trench other than the first semiconductor region of the first doping type.

14 Claims, 6 Drawing Sheets

(51) Int. Cl.
*H01L 29/74* (2006.01)
*H01L 21/762* (2006.01)
*H01L 21/761* (2006.01)
*H01L 29/735* (2006.01)

(56) References Cited

U.S. PATENT DOCUMENTS

| | | | |
|---|---|---|---|
| 8,680,621 B2 | 3/2014 | Besse et al. | |
| 9,018,072 B2 | 4/2015 | Gendron et al. | |
| 9,431,389 B2 | 8/2016 | Hwang et al. | |
| 2002/0066929 A1* | 6/2002 | Voldman | H01L 27/0251 257/355 |
| 2004/0021169 A1* | 2/2004 | Leonardi | H01L 21/76283 257/314 |
| 2004/0217425 A1 | 11/2004 | Brodsky et al. | |
| 2005/0207077 A1* | 9/2005 | Xu | H01L 29/7322 361/56 |
| 2008/0308837 A1* | 12/2008 | Gauthier, Jr. | H01L 27/0262 257/107 |
| 2009/0213506 A1* | 8/2009 | Zhan | H01L 27/0262 361/56 |
| 2010/0171149 A1 | 7/2010 | Denison et al. | |
| 2011/0176243 A1* | 7/2011 | Zhan | H01L 27/0259 361/56 |
| 2011/0186909 A1* | 8/2011 | Tsai | H01L 29/73 257/173 |
| 2012/0119331 A1* | 5/2012 | Gendron | H01L 29/7436 257/587 |
| 2013/0328125 A1 | 12/2013 | Ho | |
| 2014/0061716 A1 | 3/2014 | Zhan et al. | |
| 2014/0225156 A1 | 8/2014 | Zhan et al. | |
| 2015/0187749 A1 | 7/2015 | Dai | |
| 2016/0276332 A1 | 9/2016 | Laine et al. | |

OTHER PUBLICATIONS

Non-Final Rejection office action dated Jan. 30, 2017 for U.S. Appl. No. 14/829,961, 17 pages.
Notice of Allowance dated Sep. 20, 2017 for U.S. Appl. No. 14/829,961, 15 pages.
Restriction Requirement dated Sep. 23, 2016 for U.S. Appl. No. 14/829,961, 7 pages.

\* cited by examiner

ESD PROTECTION STRUCTURE AND METHOD OF FABRICATION THEREOF

FIELD OF THE INVENTION

This invention relates to an electrostatic discharge protection structure and a method of fabrication thereof.

BACKGROUND OF THE INVENTION

Integrated circuit (IC) devices are prone to electrostatic discharge (ESD) events, whereby external contacts of the IC devices are subjected to large electrical charges (positive or negative). Functional circuitry within an IC device is required to be protected from electrical currents created by such large electrical charges at the external contacts of the IC devices, which can cause erroneous behavior within the functional circuitry and even permanently damage the functional circuitry due to the magnitude of the electrical currents that can be generated by ESD events.

To protect the functional circuitry of an IC device from ESD events, it is known to provide susceptible external contacts of the IC device with ESD protection structures. Conventional ESD protection structures typically include thyristor structures (i.e. P-N-P-N semiconductor structures) coupled between an external contact to be protected, such as an input/output (I/O) contact of the IC device, and a power supply contact (e.g. ground or Vss) to which ESD currents are to be shunted.

Silicon on insulator (SOI) technology refers to the use of a layered silicon-insulator-silicon substrate in place of conventional silicon substrates in semiconductor manufacturing, especially microelectronics, to reduce parasitic device capacitance, thereby improving performance. SOI-based devices differ from conventional silicon-built devices in that the silicon junction is above an electrical insulator such as silicon dioxide. The implementation of SOI technology is one of several manufacturing strategies employed to allow the continued miniaturization of microelectronic devices. However, the footprint of ESD protection structures at the external contacts of such devices is a significant limiting factor in the minimum size of IC device that can be achieved.

Furthermore, conventional ESD protection structures have been found to have poor robustness against ESD gun stress tests when implemented with SOI technology due to current focalization causing hotspots within the ESD protection structures, and often do not meet ESD requirements for automotive applications and the like, for example the 150 pF/330Ω or 2 kΩ/330 pF gun model and the required +/−8 kV gun stress target.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some examples of the present invention, there is provided an electrostatic discharge (ESD) protection structure formed within an isolation trench recessed within a semiconductor substrate of an integrated circuit device. Advantageously, and as described in greater detail below, a peripheral region of an epitaxial layer of the ESD protection structure is not enclosed by an oppositely doped deep well structure, such that it abuts (and thus is in direct contact with) a wall of the isolation trench. By not enclosing the peripheral region in this manner, the width of the ESD protection structure may be reduced, thereby enabling the minimum size of IC device that is able to be achieved to be reduced.

Figure 1:
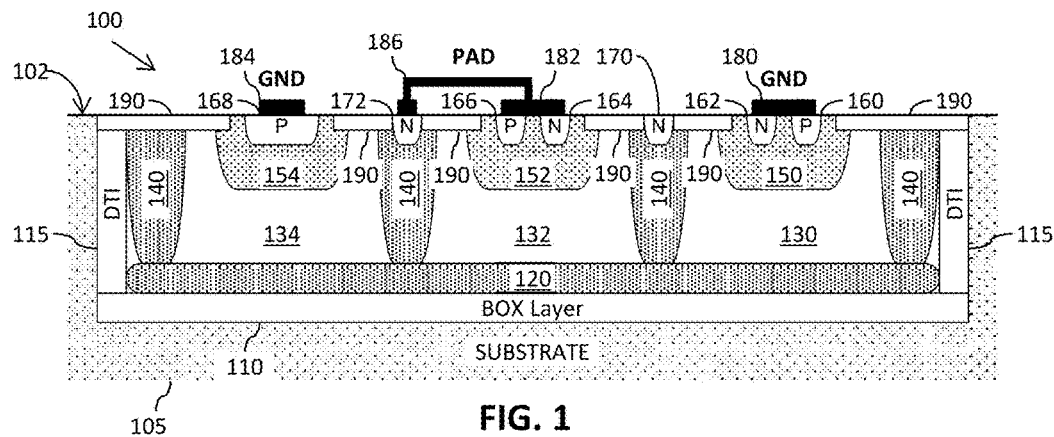
FIG. 1 and FIG. 2 schematically illustrate a convention ESD protection structure formed within a surface of a semiconductor substrate.
Figure 2:
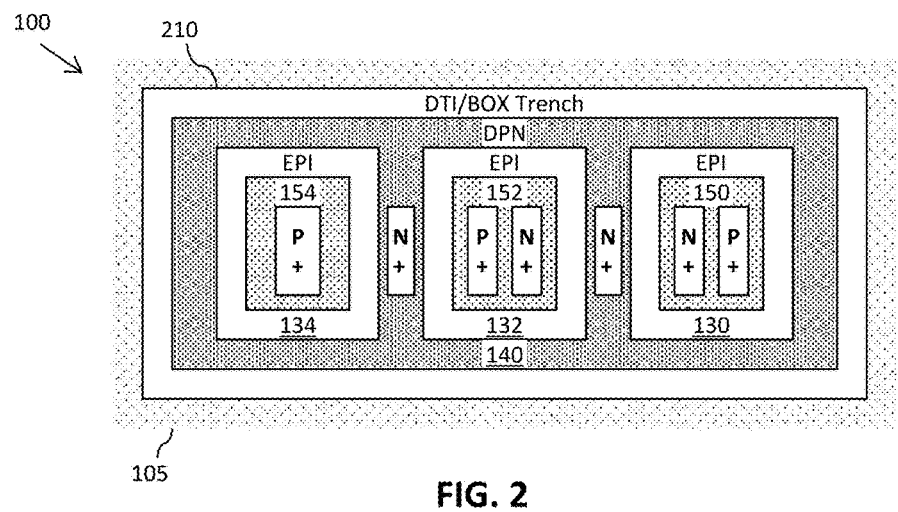

FIGS. 1 and 2 schematically illustrate a conventional ESD protection structure 100 formed within a surface 102 of a semiconductor substrate 105. In particular, FIG. 1 schematically illustrates a cross-sectional view of the ESD protection structure 100, and FIG. 2 schematically illustrates a plan view of the ESD protection structure 100. For clarity, metalized contact layers and STI layers (described in greater detail below) have been omitted from FIG. 2 so as not to obscure the view of the other components of the ESD structure 100.

The ESD protection structure 100 is enclosed within a trench 210 (FIG. 2), which isolates the ESD protection structure 100 from the substrate 105 of the IC device. The trench 210 is formed of a buried oxide (BOX) layer 110 (FIG. 1) forming 'a floor' of the trench 210, and deep trench isolation (DTI) structures 115 forming the 'walls' of the trench 210.

A P-doped epitaxial layer (130, 132, 134) substantially fills the trench 210. An N-doped buried layer (NBL) 120 is provided along the bottom of the trench as illustrated in FIG. 1. A deep N-well (DPN) structure 140 is formed within the P-doped epitaxial layer, dividing the epitaxial layer into three P-doped regions 130, 132, 134. The DPN structure 140 is formed such that it laterally encloses each of the three P-doped regions 130, 132, 134, creating a floating N-doped structure not connected to any reference potential. In the ESD protection structure 100 illustrated in FIGS. 1 and 2, the NBL 120 is arranged such that it encloses the bottom of each of the P-doped regions 130, 132, 134 isolating the P-doped regions 130, 132, 134 from the BOX layer 110.

As can be seen from FIG. 1, the (silicon) substrate layer 105, (insulator) BOX layer 110 and (silicon) epitaxial/NBL layers 120, 130, 132, 134 form a silicon-on-insulator (SOI) layered structure (silicon-insulator-silicon). The BOX layer 120 and the NBL 120 provide vertical (from the cross-sectional perspective illustrated in FIG. 1) isolation between the P-doped regions 130, 132, 134 of the epitaxial layer and the substrate 105. The DPN structure 140 provides lateral isolation between the individual P-doped regions 130, 132, 134 of the epitaxial layer, whilst the DPN structure 140 and the DTI structures 115 together provide lateral isolation between the P-doped regions 130, 132, 134 of the epitaxial layer and the substrate 105.

Although the trench 210 formed by the BOX layer 110 and the DTI structures 115 provide comprehensive isolation between the P-doped regions 130, 132, 134 of the epitaxial layer and the semiconductor substrate 105 of the IC device, the floating N-doped structure formed by the DPN structure 140 and NBL 120 is required between the P-doped regions 130, 132, 134 of the epitaxial layer and the isolation trench 210 to prevent parasitic MOS (Metal Oxide Semiconductor) structures being created.

Figure 3:
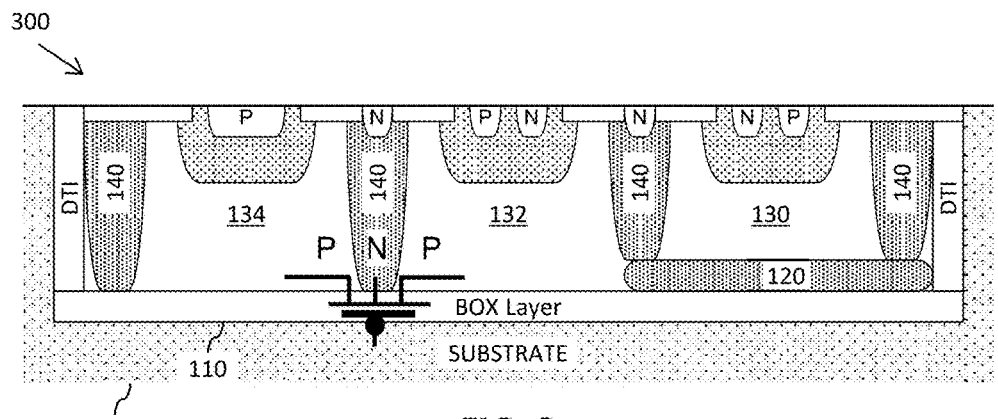
FIG. 3 illustrates an ESD protection structure in which no buried layer is formed beneath two adjacent regions of an epitaxial layer.

For example, FIG. 3 illustrates an ESD protection structure 300 in which no NBL 120 is formed beneath two adjacent regions 134, 132 of the epitaxial layer such that those regions 134, 132 of the epitaxial layer are in contact with the BOX layer 110. The resulting P-N-P structure formed by the P-doped regions 134, 132 of the epitaxial layer and the N-doped DPN structure 140 there between is separated from the semiconductor substrate by the BOX layer 110. As a result, a P-type MOS (PMOS) structure is formed with the BOX layer 110 forming the gate of the PMOS device biased to the substrate 105 (usually 0V).

Figure 4:
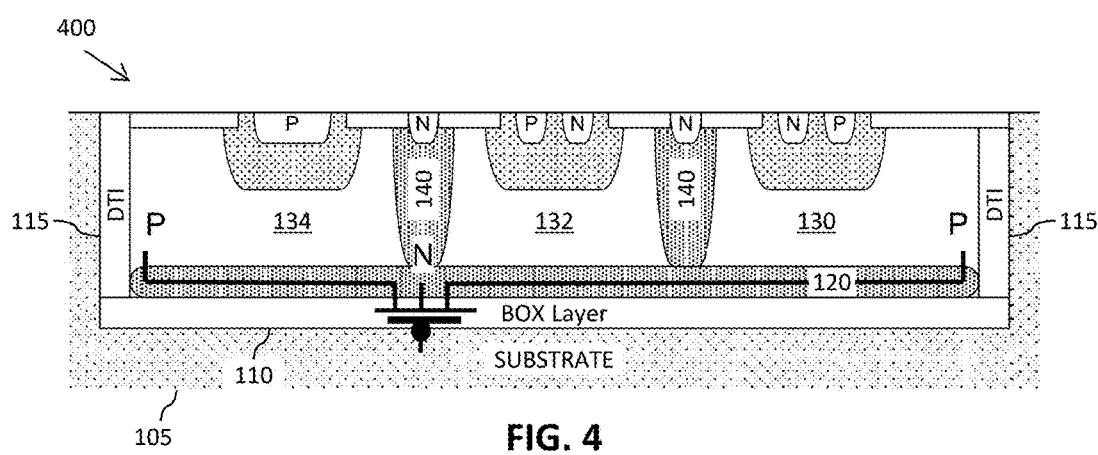
FIG. 4 illustrates an ESD protection structure in which no DPN structure is formed between outer regions of the epitaxial layer and an isolation trench.

FIG. 4 illustrates an ESD protection structure 400 in which no DPN structure 140 is formed between the outer regions 130, 134 of the epitaxial layer and the DTI structures 115 such that the outer regions 130, 134 of the epitaxial layer are in contact with the DTI structures. The resulting P-N-P structure formed by the P-doped regions 130, 134 of the epitaxial layer and the N-doped NBL 120 there between is separated from the semiconductor substrate by the BOX layer 110 and DTI structures. As a result, a P-type MOS (PMOS) structure is formed with the BOX layer 110 and DTI structures 115 combining to form the gate of the PMOS device biased to the substrate 105.

The creation of such parasitic MOS structures would result in leakage current appearing between the P-doped well regions due to activation of the parasitic MOS structures. As such, it is necessary to maintain the floating N-doped structure provided by the NBL 120 and the DPN structure 140 in order to avoid the creation of parasitic MOS structures.

However, the inventors have recognized that as long as only a PN or NP junction is formed in contact with the isolation trench 210 (formed by the BOX layer 110 and DTI structures 115), and not a PNP or NPN structure, no parasitic MOS structure will be created. Furthermore, and as described in greater detail below, the inventors have recognized that the floating N-doped structure formed by the DPN structure and NBL may be removed from around a P-well region of the epitaxial layer without forming a PNP or NPN structure in contact with the isolation trench, if that P-well region is located at a periphery of the ESD protection structure, and so long as the P-well regions remain isolated from one another.

Figure 5:
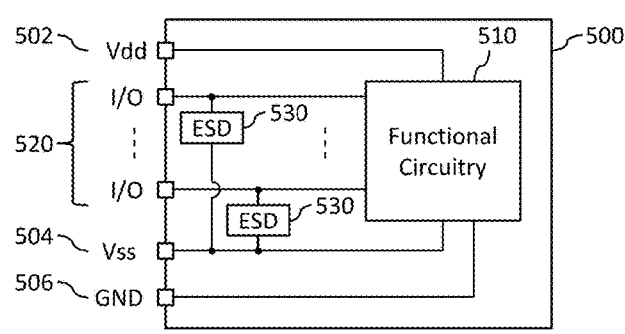
FIG. 5 illustrates a simplified block diagram of an example of an integrated circuit (IC) device.

Referring now to FIG. 5, there is illustrated a simplified block diagram of an example of an integrated circuit (IC) device 500. The IC device 500 includes functional circuitry 510 for providing the intended functionality of the IC device. Such functional circuitry 510 may include, for example:
   one or more combinational logic circuits such as one or more Boolean logic circuits;
   one or more sequential logic circuits;
   one or more processing cores;
   one or more memory elements;
   one or more clock generator circuits;
   one or more power management units;
   one or more interconnect components such as a system bus, crossbar switch or the like;
   etc.

The IC device 500 further includes power supply contacts arranged to be coupled to external power supply sources. Three such power supply contacts 502, 504, 506 are illustrated in FIG. 5 for simplicity; one positive voltage power supply contact Vdd 502; one negative voltage power supply contact Vss 504; and one ground supply contact GND 506. However, it will be appreciated that the IC device may have multiple positive or negative voltage power supply contacts 502, 504, as well as multiple ground supply contacts 506. The IC device 500 further includes at least one contact required to be protected from ESD events, such as the input/output (I/O) contacts 520 illustrated in FIG. 5. The IC device 500 further includes at least one ESD protection component 530 coupled between each of the contacts 520 required to be protected from ESD events and at least one of the power supply contacts 502, 504.

Figure 6:
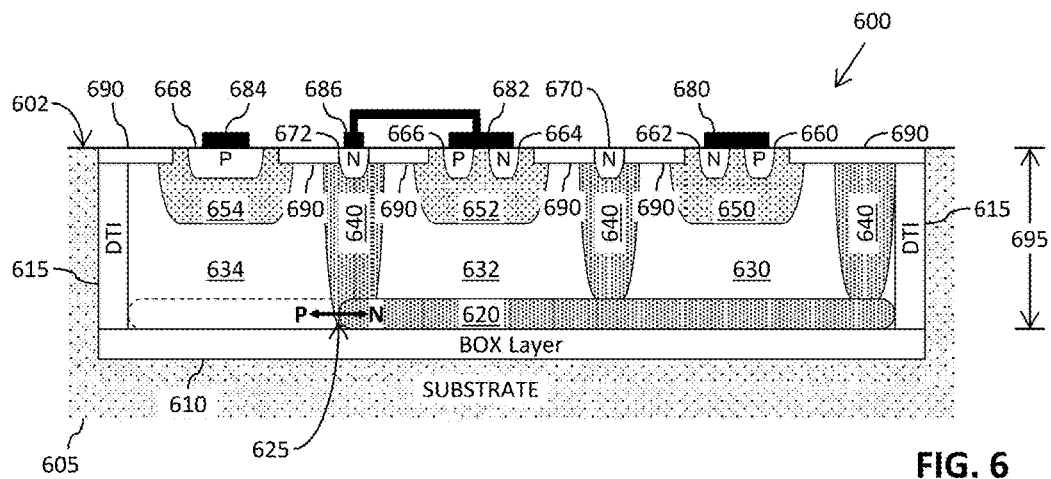
FIG. 6 and FIG. 7 illustrate examples of an ESD protection structure formed within a surface of a semiconductor substrate of an IC device.
Figure 7:
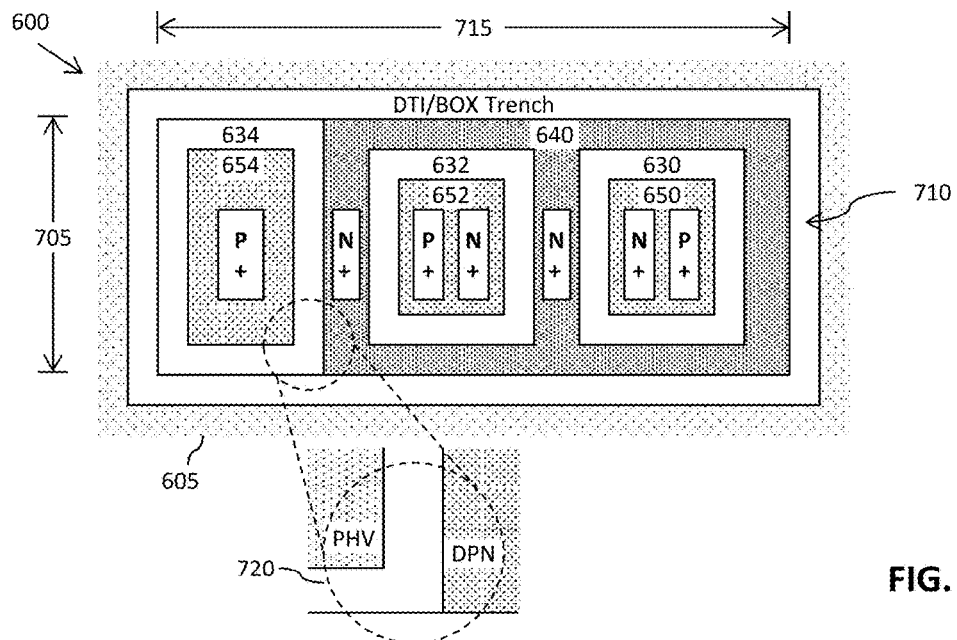

Referring now to FIGS. 6 and 7 there is illustrated an example of an ESD protection structure 600 formed within a surface 602 of a semiconductor substrate 605 of an IC device, such as may be implemented to provide the ESD protection components 530 of the IC device 500 illustrated in FIG. 5. More specifically, FIG. 6 schematically illustrates a cross-sectional view of the ESD protection structure 600 and FIG. 7 schematically illustrates a plan view of the ESD protection structure 600. For clarity, metalized contact layers (780-686) and STI layers (790), described in greater detail below, have been omitted from FIG. 7 so as not to obscure the view of the other components of the ESD structure 600.

The ESD protection structure 600 is enclosed within a trench 710 (FIG. 7), which isolates the ESD protection structure 600 from the substrate 605 of the IC device. The trench 710 is formed of a buried oxide (BOX) layer 610 (FIG. 6) forming a 'floor' of the trench 710, and deep trench isolation (DTI) structures 615 forming the 'walls' of the trench 710.

A P-doped epitaxial layer (730, 632, 634) substantially fills the trench 710. An N-doped buried layer (NBL) 620 is provided along the bottom of the trench as illustrated in FIG. 6, and as described in greater detail below. A deep N-well (DPN) structure 640 is formed within the P-doped epitaxial layer, dividing the epitaxial layer into three P-doped regions 630, 632, 634. The DPN structure 640 is formed such that it laterally encloses two of the three P-doped regions 630, 632. In the ESD protection structure 600 illustrated in FIGS. 6 and 7, the NBL 620 is arranged such that it at least encloses the bottom of the same two P-doped regions 630, 632 of the epitaxial layer, isolating the P-doped regions 630, 632 from the BOX layer 610.

The third P-doped region 634 of the epitaxial layer is not enclosed by the DPN structure 640. The third P-doped region 634 forms a peripheral region of the epitaxial layer, such that it abuts (and thus is in direct contact with) the adjacent DTI structure 615 forming a wall of the isolation trench 710. By not enclosing the third P-doped region 634 within the DPN structure 640, a PN junction 625 is formed against the isolation trench 710 by the P-doped region 634 of the epitaxial layer and the N-doped NBL 620. However, because the P-doped region 634 is a peripheral region of the epitaxial layer, no further junction is formed by the P-doped region 634 against the isolation trench 710. Furthermore, because the NBL 620 and the DPN structure 640 enclose the other two P-doped regions 630, 632, no further junction is formed against the isolation trench by the NBL 620 and DPN structure 640. Accordingly, no NPN or PNP structure is formed against the isolation trench 710, only the PN junction 625. As a result, no parasitic MOS structures are created that would result in leakage current appearing between the P-doped well regions due to activation of the parasitic MOS structures.

Advantageously, by 'removing' the part of the DPN structure 640 from around the peripheral P-doped region 634 of the epitaxial layer as illustrated in FIGS. 6 and 7, the volume of the isolation trench 710 (indicated by the broken line 810 in FIG. 8) that would have been occupied by the part of the DPN structure 640 between the peripheral P-doped region 634 of the epitaxial layer and the adjacent wall of the isolation trench 710 becomes superfluous. As such, the internal width 715 (FIG. 7) of the isolation trench 710, and thus the width of the ESD structure 600, may be reduced to remove the superfluous volume 810. In some examples, removing the part of the DPN structure from around a peripheral region of the epitaxial layer has been found to produce a 16% reduction in the width of the ESD protection structure.

As identified in the background of the invention, the footprint of ESD protection structures at the external contacts of IC devices is a significant limiting factor in the minimum size of IC device that can be achieved. Thus, by removing the part of the DPN structure 640 from around a peripheral region of the epitaxial layer in this manner, and enabling the width of the ESD protection structure 600 to be reduced, the minimum size of IC device that is able to be achieved may be reduced.

Figure 8:
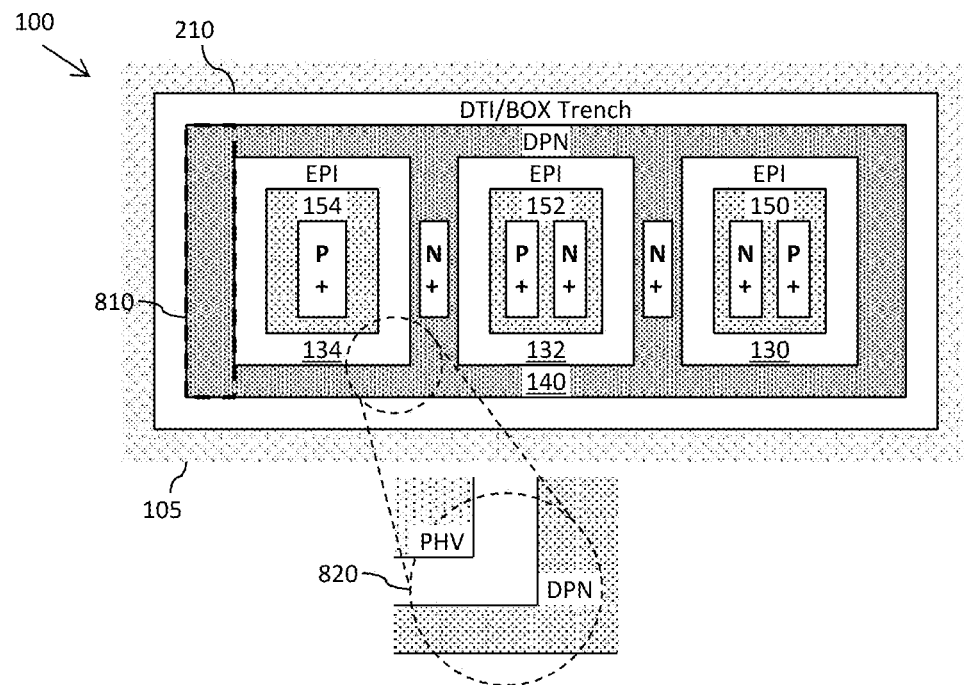
FIG. 8 illustrates a plan view of a convention ESD protection structure.

FIG. 8 illustrates a plan view of the conventional ESD protection structure 100, and highlights at 820 how the part of the DPN structure 140 enclosing the peripheral region 154 of the epitaxial layer forms corner regions within the PN junction between the P-doped region 154 of the epitaxial layer and the N-doped DPN structure 140. Such corner regions create non-uniformity in the PN junction, resulting in current focalization at the corner regions. As identified in the background of the invention, conventional ESD protection structures suffer from poor robustness against prolonged ESD gun stress tests when implemented with SOI technology due to such current focalization causing hotspots within the ESD protection structures.

However, in some examples, such as the example illustrated in FIGS. 6 and 7, the DPN structure 640 and the NBL 620 may be formed such that neither the DPN structure 640 nor the NBL 620 come between the peripheral P-doped region 634 of the epitaxial layer and the isolation trench 710. In particular, in some examples the DPN structure 640 and the NBL 620 may be formed such that a substantially uniform PN junction 625 is created across the height 700 (from the plan perspective illustrated in FIG. 7) and depth 695 (FIG. 6) of the ESD protection structure 600. By forming the DPN structure 640 and the NBL 620 such that a substantially uniform PN junction 625 is created, corner regions within the PN junction 625 between the P-doped region 654 of the epitaxial layer and the N-doped DPN structure 640 may be avoided. Advantageously, by providing such a substantially uniform PN junction 625, a more uniform current flow within the ESP protection structure 600 may be achieved, reducing the likelihood of current focalization occurring and thereby improving the robustness of the ESD protection structure 600 against prolonged ESD gun stress tests.

Thus, in accordance with some examples of one aspect of the present invention there is provided an ESD protection structure, such as the ESD structure 600 hereinbefore described with reference to FIGS. 6 and 7. The ESD protection structure 600 is formed within an isolation trench 710 recessed within a surface 602 of a semiconductor substrate 605 of an IC device, such as the IC device 500 illustrated in FIG. 5.

The ESD structure 600 includes a first semiconductor region of a first doping type, the first semiconductor region of the first doping type forming a peripheral region of the first doping type, such as the P-doped region 634 of the epitaxial layer in the example illustrated in FIGS. 6 and 7.

The ESD structure 600 further includes a second semiconductor region of the first doping type, such as the P-doped regions 630 and 632 of the epitaxial layer in the example illustrated in FIGS. 6 and 7.

The ESD structure 600 further includes at least one semiconductor structure of a second doping type opposite to the first doping type formed to provide lateral isolation between the semiconductor regions of the first doping type and isolation between the at least one further semiconductor region of the first doping type and the isolation trench. For example, such a semiconductor structure of a second doping type is formed by the N-doped DPN structure 640 and the N-doped NBL 620 in the example illustrated in FIGS. 6 and 7.

The semiconductor structure 640, 620 of the second doping type is formed such that no semiconductor region of the second doping type is formed between a peripheral side of the first semiconductor region 634 of the first doping type and a wall 615 of the isolation trench 710, said peripheral side of the first semiconductor region 634 of the first doping type being distal from the at least one further semiconductor region 630, 632 of the first doping type.

Furthermore, the semiconductor structure 640, 620 of the second doping type is formed such that no semiconductor region of the first doping type is in contact with the isolation trench 710 other than the first semiconductor region 634 of the first doping type.

Advantageously, by forming the semiconductor structure of the second doping type such that no semiconductor region of the second doping type is formed between a peripheral side of the first semiconductor region 634 of the first doping type and the wall 615 of the isolation trench 710, the width of the isolation trench 710, and thus the width of the ESD structure 600, may be reduced to remove the superfluous volume (e.g. the volume 810 illustrated in FIG. 8). Furthermore, by forming the semiconductor structure of the second doping type such that no semiconductor region of the first doping type is in contact with the isolation trench 710 other than the first semiconductor region 634 of the first doping type, no NPN or PNP structure is formed against the isolation trench 710, only the PN junction 625. As a result, no parasitic MOS structures are created that would result in leakage current appearing between the P-doped well regions due to activation of the parasitic MOS structures.

In some examples, a well region of the first doping type may be formed within a surface of the first semiconductor region 634 of the first doping type, the surface of the first semiconductor region 634 of the first doping type being co-planar with the surface 602 of the semiconductor substrate 605. The at least well region of the first doping type may be formed such that it abuts the wall 615 of the isolation trench 710. In this manner, the amount by which the width of the isolation trench 710 is able to be reduced may be maximized.

In some examples, no semiconductor region of the second doping type may be formed between the first semiconductor region of the first doping type and the isolation trench. In this manner a substantially uniform PN junction or a substantially uniform NP junction (e.g. PN junction 625) may be formed between the first semiconductor region 634 of the first doping type and the at least one semiconductor structure 640, 620 of the second doping type. Advantageously, by providing such a substantially uniform PN or NP junction 625, a more uniform current flow within the ESP protection structure 600 may be achieved, reducing the likelihood of current focalization occurring and thereby improving the robustness of the ESD protection structure 600 against prolonged ESD gun stress tests.

In some examples, the at least one semiconductor structure of the second doping type may include at least one deep-well structure (such as the DPN structure 640 in the example illustrated in FIGS. 6 and 7) providing lateral isolation between the semiconductor regions 630, 632, 634 of the first doping type, and lateral isolation between the at least one further semiconductor region 632, 634 of the first doping type and the isolation trench 710. In some examples, the at least one semiconductor structure of the second doping type may further include a buried layer of the second doping type (such as the N-doped NBL 620 in the example illustrated in FIGS. 6 and 7) providing isolation between at least the at least one further semiconductor region 632, 634 of the first doping type and a floor of the isolation trench.

In some examples, the first and at least one further semiconductor regions of the first doping type may be formed within an epitaxial layer within the semiconductor substrate.

In some examples, the isolation trench may include a BOX layer 610 formed to provide a floor of the isolation trench 710, and one or more DTI formation(s) 615 formed to provide walls of the isolation trench 710.

Referring back to FIGS. 6 and 7, and for completeness, the NBL 620 and the DPN structure 640 form a floating N-doped structure not connected to any reference potential. The (silicon) substrate layer 605, (insulator) BOX layer 610 and (silicon) epitaxial/NBL layers 620, 630, 632, 634 form a silicon-on-insulator (SOI) layered structure (silicon-insulator-silicon). The BOX layer 620 and the NBL 620 provide vertical (from the cross-sectional perspective illustrated in FIG. 6) isolation between the P-doped regions 630, 632, 634 of the epitaxial layer and the substrate 605. The DPN structure 640 provides lateral isolation between the individual P-doped regions 630, 632, 634 of the epitaxial layer, whilst the DPN structure 640 and the DTI structures 615 together provide lateral isolation between the P-doped regions 630, 632, 634 of the epitaxial layer and the substrate 605.

P-doped wells 650, 652, 654 are formed within the upper surfaces of the P-doped regions 630, 632, 634 of the epitaxial layer. The use of the term 'upper surface' used herein is intended to refer to a surface of a region or structure (e.g. a P-doped well 650, 652, 654 in this scenario) that is substantially co-planar with the surface 602 of the semiconductor substrate 605 within which the ESD structure 600 is formed. Typically, the P-doped wells 650, 652, 654 will have a P-dopant concentration higher than that of the P-doped epitaxial layer. In general, an increase in doping concentration affords an increase in conductivity due to the higher concentration of carriers available for conduction.

Contact regions 660-668 are formed within upper surfaces of the P-doped wells 650, 652, 654, with metalized contact layers 680-684 (FIG. 6) formed over the contact regions 660-668. N-doped contact regions 670, 672 are also formed within the upper surface of the DPN structure 640 between the P-doped regions 630, 632, 634 of the epitaxial layer. A metalized contact layer 684 (FIG. 6) is formed over the N-doped contact region 672 formed between the second and third P-doped regions 632, 634 of the epitaxial layer. The metalized contact layers 680 and 684 are arranged to be electrically coupled to a power supply (e.g. ground of Vss) of the IC device, whilst metal contact layers 682, 686 and arranged to be electrically coupled to a contact of the IC device to be protected. Typically, the contact regions have a dopant concentration higher than that of the P-doped wells 650, 652, 654.

Shallow trench isolation (STI) regions 690 are provided on the surface of the ESD protection structure 600 to prevent electrical current leakage between contact regions within adjacent P-doped wells 650, 652, 654, and between the ESD protection structure 600 more generally and the substrate 605.

A P-N-P-N thyristor structure is formed within the ESD protection structure 600 between the metalized contact layer 682 coupled to the contact of the IC device to be protected and the metalized contact layer 680 coupled to the power supply contact (e.g. ground or Vss) to which ESD currents are to be shunted. Specifically, the thyristor structure includes:

P-type layer including: the P-doped region 632 of the epitaxial layer, the P-doped well 652 and the P-doped contact region 666;

N-type layer including: the N-doped DPN structure 640 (between the first and second P-doped regions 630, 632 of the epitaxial layer) and N-doped contact region 670;

P-type layer including: the P-doped region 630 of the epitaxial layer and the P-doped well 650; and N-type layer including: the N-doped contact region 662.

A further PNP transistor structure is formed within the ESD protection structure 600 across the N-doped DPN structure 640 between the second and third P-doped regions 632, 634 of the epitaxial layer. This PNP bipolar transistor structure controls the forward triggering voltage of the ESD protection structure 600.

Figure 9:
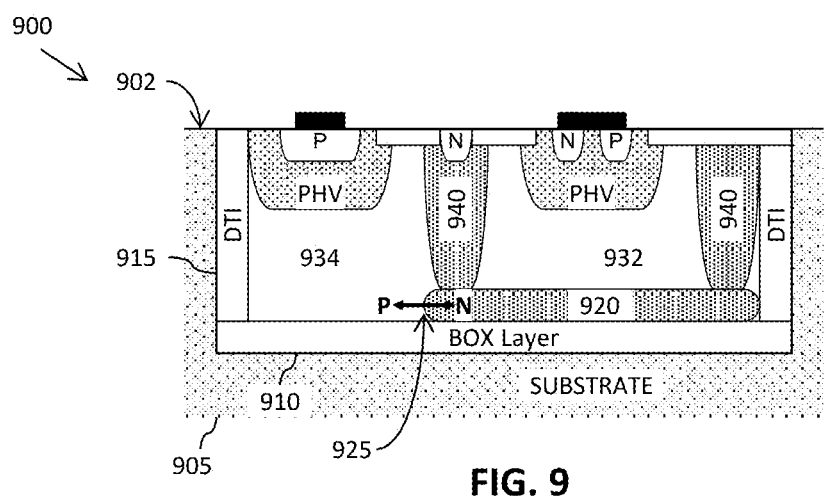
FIG. 9 schematically illustrates a simplified cross-sectional view of an example of an alternative ESD protection structure.

It will be appreciated that the present invention is not limited to the specific ESD protection structure 600 illustrated in FIGS. 6 and 7, and it is contemplated that the present invention may be implemented within various alternative ESD protection structures. FIG. 9 schematically illustrates a simplified cross-sectional view of one example of such an alternative ESD protection structure 900 within which the present invention has been implemented. For ease of understanding, like features have been assigned like reference numerals within FIG. 9 as within FIGS. 7 and 8.

The ESD protection structure 900 is enclosed within a trench, which isolates the ESD protection structure 900 from the substrate 905 of the IC device. The trench is formed of a BOX layer 910 forming a 'floor' of the trench, and DTI structures 915 forming the 'walls' of the trench.

A P-doped epitaxial layer (1032, 934) substantially fills the trench. An N-doped buried layer (NBL) 920 is provided along the bottom of the trench as illustrated in FIG. 9, and as described in greater detail below. A deep N-well (DPN)

structure 940 is formed within the P-doped epitaxial layer, dividing the epitaxial layer into two P-doped regions 932, 934. The DPN structure 940 is formed such that it laterally encloses one of the P-doped regions 932. In the ESD protection structure 900 illustrated in FIG. 9, the NBL 920 is arranged such that it at least encloses the bottom of the same P-doped region 932 of the epitaxial layer, isolating the P-doped region 932 from the BOX layer 910.

The second P-doped region 934 of the epitaxial layer is not enclosed by the DPN structure 940. The second P-doped region 934 forms a peripheral region of the epitaxial layer, such that it abuts (and thus is in direct contact with) the adjacent DTI structure 915 forming a wall of the isolation trench. By not enclosing the second P-doped region 934 within the DPN structure 940, a PN junction 925 is formed against the isolation trench by the P-doped region 934 of the epitaxial layer and the N-doped NBL 920. However, because the P-doped region 934 is a peripheral region of the epitaxial layer, no further junction is formed by the P-doped region 934 against the isolation trench. Furthermore, because the NBL 920 and the DPN structure 940 enclose the other P-doped region 932, no further junction is formed against the isolation trench by the NBL 920 and DPN structure 940. Accordingly, no NPN or PNP structure is formed against the isolation trench, only the PN junction 925. As a result, no parasitic MOS structures are created that would result in leakage current appearing between the P-doped well regions due to activation of the parasitic MOS structures. Furthermore, a substantially uniform PN junction 925 across the ESD protection structure 900, enabling a more uniform current flow within the ESP protection structure 900 may be achieved.

Figure 10:
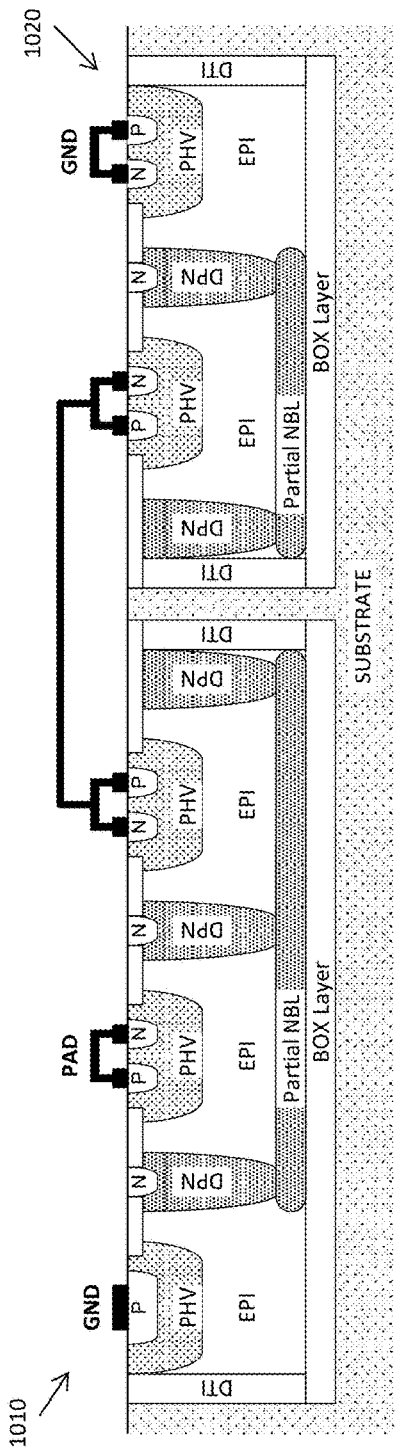
FIG. 10 and FIG. 11 schematically illustrate simplified cross-sectional views of further alternative examples of ESD protection arrangements.
Figure 11:
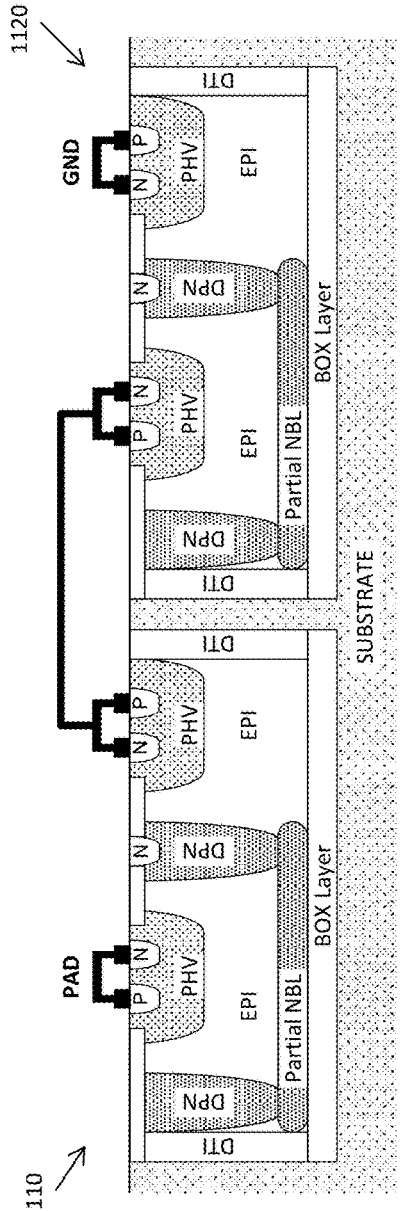

FIGS. 10 and 11 schematically illustrate simplified cross-sectional views of further alternative examples of ESD protection arrangements within which the present invention has been implemented. In each of FIGS. 10 and 11, an ESD protection arrangement is illustrated including two 'stacked' ESD structures, each of which has been adapted in accordance with examples of the present invention. FIG. 10 illustrates an example of an ESD protection arrangement in which an ESD protection structure 1010 similar to the ESD protection structure 700 illustrated in FIGS. 7 and 8 has been stacked with an ESD protection structure 1020 similar to the ESD protection structure 900 illustrated in FIG. 9. FIG. 11 illustrates an example of an ESD protection arrangement in which two ESD protection structures 1110, 1120 similar to the ESD protection structure 900 illustrated in FIG. 9 have been stacked together.

Figure 12:
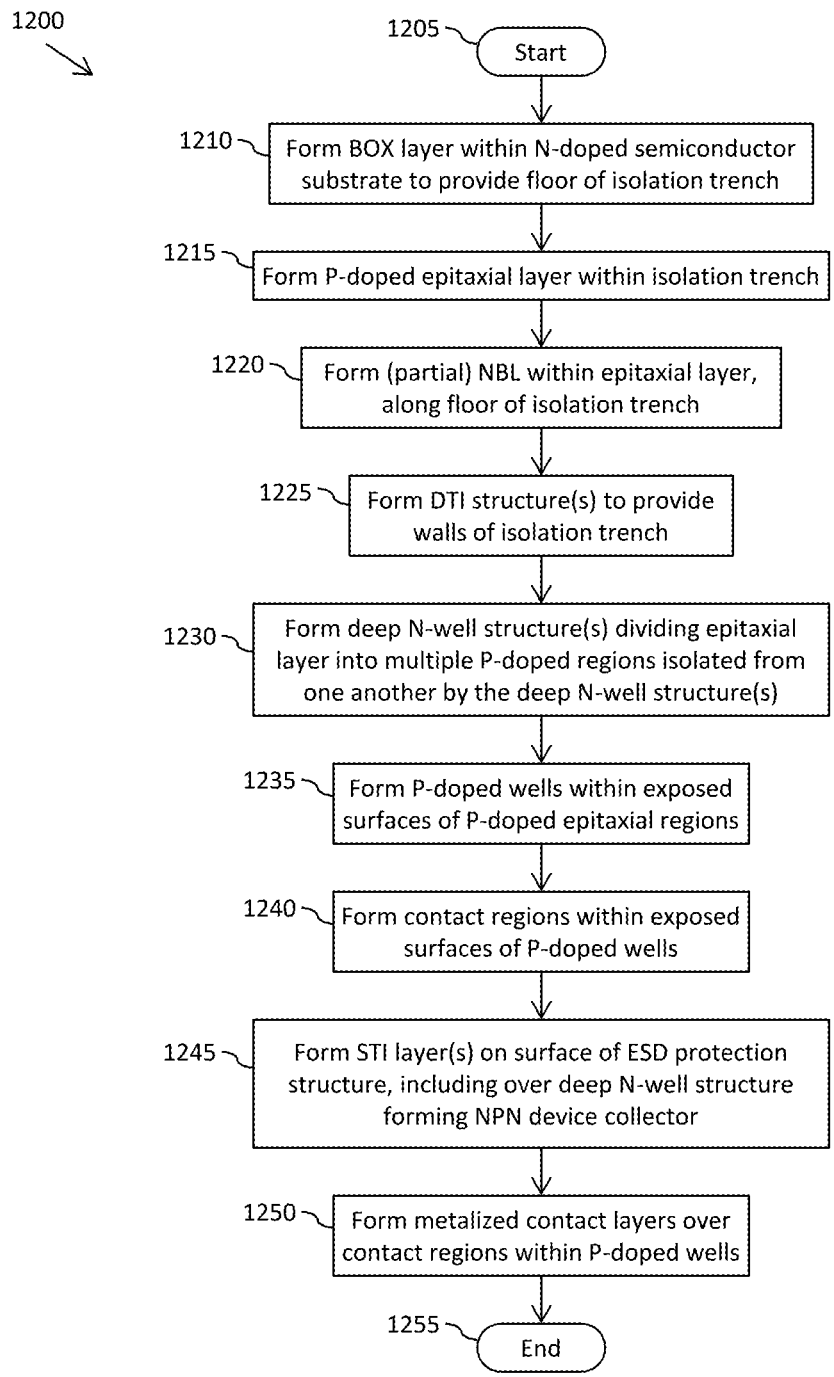
FIG. 12 illustrates a simplified flowchart of an example of a method of fabricating an ESD protection structure within a semiconductor substrate of an integrated circuit device.

Referring now to FIG. 12, there is illustrated a simplified flowchart 1200 of an example of a method of fabricating an ESD protection structure within a semiconductor substrate of an integrated circuit device, such as the ESD protection structure 700 illustrated in FIGS. 7 and 8. It is to be understood that the simplified flowchart 1200 illustrated in FIG. 12 is intended to illustrate general procedures to be performed during the fabrication of the integrated circuit device in order to form the structural components required to implement some examples of the present invention. However, as will be understood by a skilled person, the fabrication process of an integrated circuit device is typically more complex than the simplified flowchart 1200 illustrated in FIG. 12, with several of the general procedures illustrated requiring multiple fabrication process to be performed at different stages of the overall fabrication process, and with the implementation of some of the general procedures illustrated in FIG. 12 at least partly overlapping. Furthermore, it will be appreciated that the specific order of the general procedures illustrated in FIG. 12 is not intended to be limiting, and the various structural components may be formed in any appropriate order.

The fabrication process illustrated in FIG. 12 starts at 1205 and includes the formation of a BOX (buried oxide) layer within the semiconductor substrate, at 1210, to provide a floor of an isolation trench within which the ESD protection structure is contained, such as the BOX layer 710 in FIGS. 7 and 8. One known technique for forming the BOX Layer is by way of a Separation by Implantation of Oxygen (SIMOX) process which uses an oxygen ion beam implantation process followed by high temperature annealing to create a buried SiO2 layer. Alternatively, the BOX layer may be formed by way of wafer bonding, whereby an insulating layer is formed by directly bonding oxidized silicon with a second substrate.

An epitaxial layer is formed within the surface of the semiconductor substrate over the BOX layer, at 1215, for example by way of a vapor-phase epitaxy process.

An NBL, such as the NBL 720 in FIGS. 7 and 8, is formed on top of the BOX layer, at 1220, for example by way of an N-type dopant implantation procedure. In some examples, the NBL may be a partial N-doped buried layer, whereby a region of the epitaxial layer remains in contact with the BOX layer.

One or more DTI structures are formed, at 1225, to provide walls of the isolation trench, for example by way of etching a pattern of the required DTI structure(s) in the semiconductor substrate, depositing one or more dielectric materials (such as silicon dioxide) to fill the trenches, and removing the excess dielectric using a technique such as chemical-mechanical planarization.

One or more DPN structure(s) is/are formed, at 1230, to divide the epitaxial layer into a first P-doped region (e.g. the P-doped region 734 in FIGS. 7 and 8) and at least one further P-doped region (e.g. the P-doped regions 730, 732 in FIGS. 7 and 8) laterally isolated from one another by the DPN structure(s). The NBL formed at 1220 is formed to isolate at least the at least one further P-doped region of the epitaxial layer from the BOX layer. Significantly the DPN structure(s) is/are formed such that no N-doped semiconductor region is formed between a peripheral side of the first P-doped region (e.g. the P-doped region 734) and a wall of the isolation trench, and no P-doped semiconductor region is in contact with the isolation trench other than the first P-doped region (e.g. the P-doped region 734). In some examples, the NBL formed at 1220 may be formed such the no N-doped semiconductor region is formed between the first P-doped region (e.g. the P-doped region 734) and the isolation trench, and such that a substantially uniform PN junction is formed between the first P-doped region (e.g. the P-doped region 734) and the N-doped NBL and DTI structures.

In the example illustrated in FIG. 12, P-doped wells are formed within exposed (upper) surfaces of the P-doped regions of the epitaxial layer, at 1235, for example by way of a P-type dopant implantation or diffusion procedure.

Contact regions may then be formed within exposed (upper) surfaces of the P-doped wells, for example by way of one or more dopant implantation or diffusion procedure(s). For example, an N-doped contact region may be formed within a surface of a P-doped well within at least one of the P-doped regions of the epitaxial layer such that a thyristor structure is formed within the ESD protection structure having:
- an N-doped layer including the N-doped contact region;
- a P-doped layer including the region of the epitaxial layer and the P-doped well containing the N-doped contact region;
- an N-doped layer including a region of the DPN structure between the region of the epitaxial layer containing the N-doped contact region and an adjacent region of the epitaxial layer; and
- a P-doped layer including said adjacent region of the epitaxial layer.

In some examples, N-doped contact regions may be formed within the surface of parts of the DPN structure(s) between the P-doped regions of the epitaxial layer Shallow trench isolation (STI) layers are formed on the surface of the ESD protection structure, at 1245, such that the contact regions are left exposed.

Metalized contact layers are formed over at least some of the contact regions, at 1250.

The fabrication process illustrated in FIG. 12 ends at 1255.

The present invention has been described with reference to particular dopant-types; i.e. regions and structures being either P-doped or N-doped. However, it will be appreciated that the present invention is not limited to the particular dopant arrangements hereinbefore described and as illustrated in the accompanying drawings, and in some alternative examples it is contemplated that the dopant types may be reversed. For example, in the illustrated examples regions/structures of a first dopant type have been illustrated and described as being P-doped regions/structures, whilst regions/structures of a second dopant type have been illustrated and described as being N-doped regions/structures. However, it is contemplated that in alternative examples the regions/structures of the first dopant type may alternatively include N-doped regions/structures, and the regions/structures of the second dopant type may alternatively include P-doped regions/structures.

Furthermore, because the illustrated embodiments of the present invention may for the most part, be implemented using fabrication processes and procedures known to those skilled in the art, details of such processes and procedures have not been explained in any greater extent than that considered necessary for the understanding and appreciation of the underlying concepts of the present invention and in order not to obfuscate or distract from the teachings of the present invention.

It is to be understood that the term "or" used herein is to be interpreted either exclusively or inclusively, depending upon which is broader in terms of the context.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The words 'comprising' and 'including' do not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An electrostatic discharge, ESD, protection structure; the ESD protection structure being formed within an isolation trench recessed within a semiconductor substrate of an integrated circuit device and comprising:
- a first semiconductor region of a first doping type, the first semiconductor region of the first doping type comprising a peripheral region of the first doping type,
- a second semiconductor region of the first doping type, and
- at least one semiconductor structure of a second doping type opposite to the first doping type formed to provide:
  - lateral isolation between the semiconductor regions of the first doping type, and
  - isolation between the second semiconductor region of the first doping type and the isolation trench;
- the at least one semiconductor structure of the second doping type is formed such that:
  - no semiconductor region of the second doping type is formed between a peripheral side of the first semiconductor region of the first doping type and a wall of the isolation trench, said peripheral side of the first semiconductor region of the first doping type being distal from the second semiconductor region of the first doping type, and no semiconductor region of the first doping type is in contact with the isolation trench other than the first semiconductor region of the first doping type.

2. The ESD protection structure of claim 1, further comprising at least one well region of the first doping type formed within a surface of the first semiconductor region of the first doping type, the surface of the first semiconductor region of the first doping type being co-planar with a surface of the semiconductor substrate, the at least one well region of the first doping type abutting the wall of the isolation trench.

3. The ESD protection structure of claim 1, comprising no semiconductor region of the second doping type formed between the first semiconductor region of the first doping type and the isolation trench.

4. The ESD protection structure of claim 3, further comprising one of a uniform PN junction and a uniform NP junction formed between the first semiconductor region of the first doping type and the at least one semiconductor structure of the second doping type.

5. The ESD protection structure of claim 1, wherein the at least one semiconductor structure of the second doping type comprises:
at least one deep-well structure providing lateral isolation between the semiconductor regions of the first doping type and lateral isolation between the second semiconductor region of the first doping type and the isolation trench, and
a buried layer of the second doping type providing isolation between at least the second semiconductor region of the first doping type and a floor of the isolation trench.

6. The ESD protection structure of claim 1, wherein the first and second semiconductor regions of the first doping type are formed within an epitaxial layer within the semiconductor substrate.

7. The ESD protection structure of claim 1, wherein the isolation trench comprises:
a buried oxide, BOX, layer formed to provide a floor of the isolation trench, and
at least one deep trench isolation, DTI, formation formed to provide walls of the isolation trench.

8. An integrated circuit device comprising at least one semiconductor substrate comprising at least one electrostatic discharge, ESD, protection structure; the ESD protection structure being formed within an isolation trench recessed within a semiconductor substrate of an integrated circuit device and comprising:
a first semiconductor region of a first doping type, the first semiconductor region of the first doping type comprising a peripheral region of the first doping type,
a second semiconductor region of the first doping type, and
at least one semiconductor structure of a second doping type opposite to the first doping type formed to provide:
lateral isolation between the semiconductor regions of the first doping type, and
isolation between the second semiconductor region of the first doping type and the isolation trench;
the at least one semiconductor structure of the second doping type is formed such that:
no semiconductor region of the second doping type is formed between a peripheral side of the first semiconductor region of the first doping type and a wall of the isolation trench, said peripheral side of the first semiconductor region of the first doping type being distal from the second semiconductor region of the first doping type, and
no semiconductor region of the first doping type is in contact with the isolation trench other than the first semiconductor region of the first doping type.

9. The ESD protection structure of claim 8, further comprising at least one well region of the first doping type formed within a surface of the first semiconductor region of the first doping type, the surface of the first semiconductor region of the first doping type being co-planar with a surface of the semiconductor substrate, the at least one well region of the first doping type abutting the wall of the isolation trench.

10. The ESD protection structure of claim 8, comprising no semiconductor region of the second doping type formed between the first semiconductor region of the first doping type and the isolation trench.

11. The ESD protection structure of claim 10, further comprising one of a uniform PN junction and a uniform NP junction formed between the first semiconductor region of the first doping type and the at least one semiconductor structure of the second doping type.

12. The ESD protection structure of claim 8, wherein the at least one semiconductor structure of the second doping type comprises:
at least one deep-well structure providing lateral isolation between the semiconductor regions of the first doping type and lateral isolation between the second semiconductor region of the first doping type and the isolation trench, and
a buried layer of the second doping type providing isolation between at least the second semiconductor region of the first doping type and a floor of the isolation trench.

13. The ESD protection structure of claim 8, wherein the first and second semiconductor regions of the first doping type are formed within an epitaxial layer within the semiconductor substrate.

14. The ESD protection structure of claim 8, wherein the isolation trench comprises:
a buried oxide, BOX, layer formed to provide a floor of the isolation trench, and
at least one deep trench isolation, DTI, formation formed to provide walls of the isolation trench.

* * * * *